(12) United States Patent
Liu

(10) Patent No.: US 7,782,160 B2
(45) Date of Patent: Aug. 24, 2010

(54) CENTRAL FREQUENCY ADJUSTMENT DEVICE AND ADJUSTABLE INDUCTOR LAYOUT USING TRIMMABLE WIRE

(75) Inventor: Ren Chieh Liu, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/021,294

(22) Filed: Jan. 28, 2008

(65) Prior Publication Data

US 2008/0180194 A1    Jul. 31, 2008

(30) Foreign Application Priority Data

Jan. 30, 2007    (TW) .............................. 96103303 A

(51) Int. Cl.
*H03J 3/22*    (2006.01)

(52) U.S. Cl. ......................................... 334/65; 334/75

(58) Field of Classification Search ................... 334/71, 334/75, 64, 65; 336/10, 116, 144, 180; 333/174
See application file for complete search history.

(56) References Cited

U.S. PATENT DOCUMENTS

| | | | | | |
|---|---|---|---|---|---|
| 3,947,934 | A | * | 4/1976 | Olson | 29/25.42 |
| 4,035,695 | A | * | 7/1977 | Knutson et al. | 361/782 |
| 4,494,100 | A | * | 1/1985 | Stengel et al. | 336/200 |
| 5,239,289 | A | * | 8/1993 | Ferraiolo et al. | 336/180 |

\* cited by examiner

*Primary Examiner*—Benny Lee
(74) *Attorney, Agent, or Firm*—Quintero Law Office

(57) ABSTRACT

The present invention provides a central frequency adjustment device and adjustable inductor layout; wherein, the central frequency adjustment device is applied in an inductor/capacitor tank (LC tank) for adjusting the central frequency of the LC tank. The device comprises a first inductor with a first end and a second end; a second inductor with one end coupled with the second end of the first inductor; and, a first trimmable wire connected to the first inductor in parallel and to the second inductor in series, which adjusts the central frequency by cutting off the first trimmable wire.

7 Claims, 7 Drawing Sheets

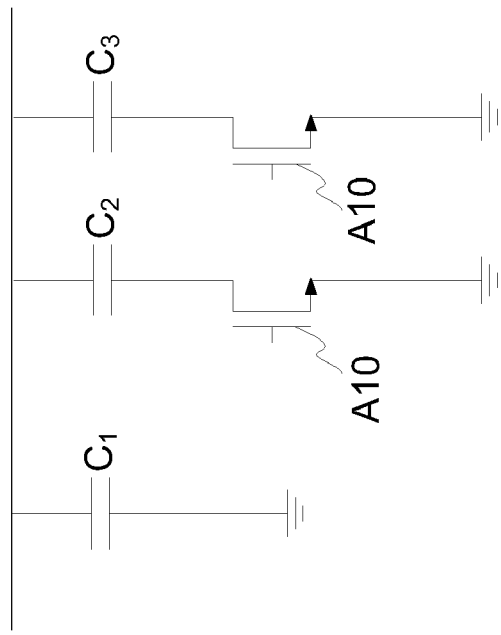
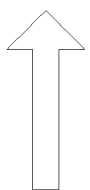
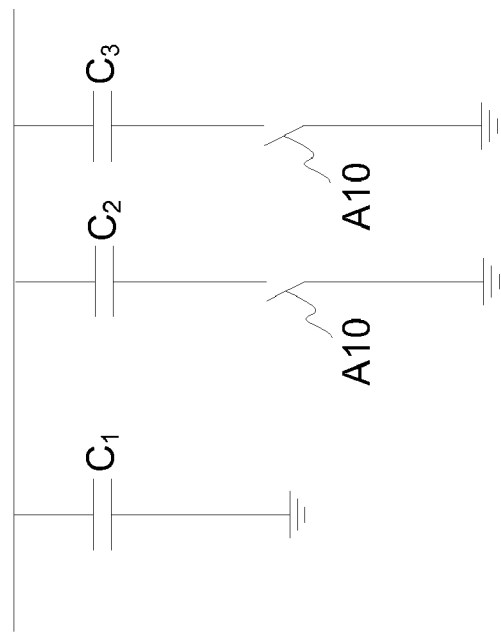
Fig. 1A (Prior Art)

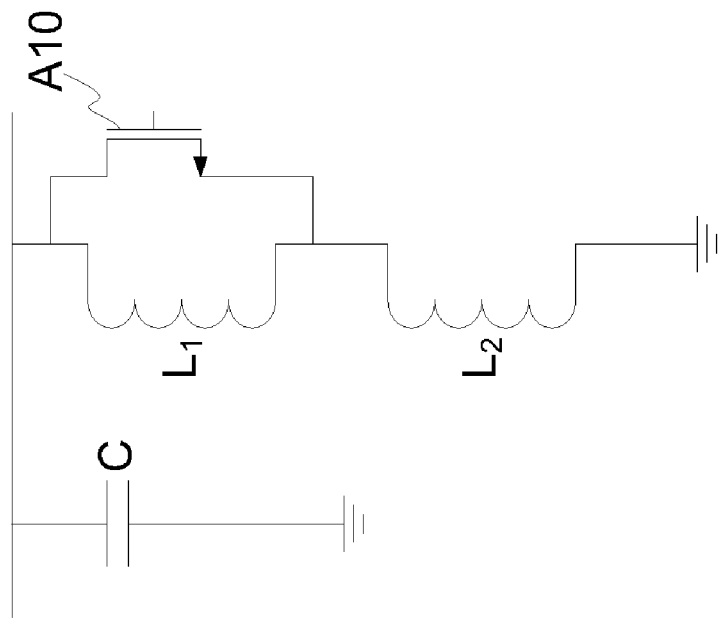
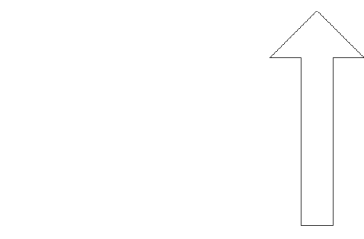
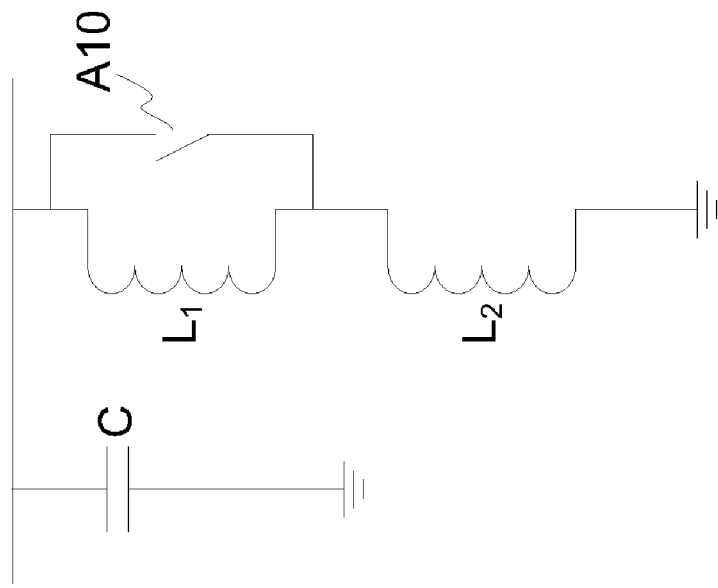
Fig. 1C (Prior Art)

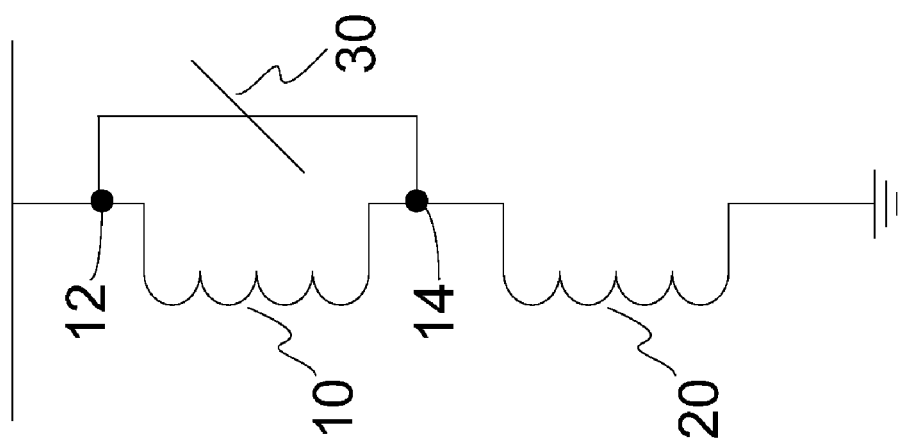

CENTRAL FREQUENCY ADJUSTMENT DEVICE AND ADJUSTABLE INDUCTOR LAYOUT USING TRIMMABLE WIRE

CROSS-REFERENCES TO RELATED APPLICATIONS

This non-provisional application claims priority under 35 U.S.C. §119(a) on Patent Application No(s). 096103303 filed in Taiwan, R.O.C. on Jan. 30, 2007, the entire contents of which are hereby incorporated by reference.

FIELD OF INVENTION

The present invention relates to a central frequency adjustment device and adjustable inductor layout, and particularly a central frequency adjustment device and adjustable inductor layout without reducing the Q factor or increasing the layout area.

BACKGROUND

The inductor/capacitor tank circuit (hereinafter "LC tank") could be applied in various circuits, for example: a modulator, a Voltage Controlled Oscillator (VCO), etc. The central frequency (f) of an LC tank could be represented by the formula $$f = \frac{1}{2\pi\sqrt{LC}}.$$

In order to overcome the central frequency offset from the ideal value of the design, adjustment of the capacitance (C) or the inductance (L) is required. Conventionally, there are three methods for adjusting the capacitance or inductance and they will be described as follows.

Please refer to FIG. 1A, which is a diagram of a conventional switching capacitor. Capacitors $C_1$, $C_2$ and $C_3$ are connected in parallel and capacitors $C_2$ and $C_3$ are respectively connected in series with switches A10. It should be noted that although not required, switch A10 could be implemented with a MOS transistor. Capacitors $C_2$ and $C_3$ are loaded onto the LC tank when switch A10 is turned on, whereas capacitors $C_2$ and $C_3$ are unloaded from the LC tank when switch A10 is turned off. The shortcoming of this method is that switch A10 generates parasitic resistance. Since the Q factor (Q) of the LC tank could be derived with the formula $$Q = \frac{W_0 L}{R} = \frac{1}{RW_0 C},$$

where $W_0$ is resonant frequency and R is resistance, the parasitic resistance generated in switch A10 would reduce the Q factor of the LC tank, which represents a reduction of circuit performance.

Please refer to FIG. 1B, which is a diagram of a conventional trimmable capacitor. Capacitors $C_1$, $C_2$ and $C_3$ are connected in parallel, and capacitors $C_2$ and $C_3$ respectively are connected in series with trimmable wire A20. When reduction of capacitance is required (for increasing the central frequency of LC tank), trimmable wire A20 (which is serially coupled with either capacitor $C_2$ or $C_3$), is trimmed to unload capacitor $C_2$ or $C_3$ from the LC tank. The advantage of this method is that parasitic resistance is not generated, and the Q factor is not reduced thereby. However, this method works only when an increase of the central frequency is required.

Please refer to FIG. 1C, which is a diagram of a conventional switching inductor. Inductors $L_1$ and $L_2$ are connected with each other in series, and are in turn connected in parallel with capacitor C. Inductor $L_1$ is also connected with switch A10 in parallel. It should be noted that although not required, switch A10 could be implemented with a field-effect transistor (FET). Inductor $L_1$ is loaded onto the LC tank when switch A10 is turned off, and unloaded from the LC tank when switch A10 is turned on. The shortcoming of this method is that switch A10 will also generate parasitic resistance, which reduces the Q factor of the LC tank, and further reduces the circuit performance.

It may be seen from the preceding, therefore, that adjustment of the Q factor is an important issue.

SUMMARY OF THE INVENTION

In view of the above, the present invention provides a central frequency adjustment device and adjustable inductor layout in which the central frequency adjustment device of the present invention is provided with the advantages of reducing the central frequency without reducing the Q factor. Furthermore, the adjustable inductor layout of the present invention is not only provided with the advantage of a reduction in the central frequency without reducing the Q factor, but also the layout method does not increase the layout area. Thus, the method provides the advantage of saving layout area, improving the conventional layout method. Furthermore, the central frequency adjustment device of the present invention includes a cut-off capacitor, which can both reduce and increase the central frequency without causing a reduction of the Q factor.

The central frequency adjustment device of the present invention can be applied to a LC tank for adjusting the central frequency of the LC tank. The central frequency adjustment device comprises a first inductor with a first end and a second end; a second inductor with one end coupled with the second end of the first inductor; and, a first trimmable wire, which is connected to the first inductor in parallel, and to the second inductor in series, by cutting off the first trimmable wire to adjust the central frequency.

The central frequency adjustment device further comprises a second trimmable wire and a capacitor; wherein the second trimmable wire is coupled with the first end of the first inductor, a capacitor is connected to the second trimmable wire in series by cutting off the second trimmable wire to adjust the central frequency.

The adjustable inductor layout of the present invention can be applied to the LC tank to adjust the central frequency of the LC tank. The adjustable inductor layout comprises an inductor winding including a first terminal and a second terminal, and forming a plurality of loop portions from the first terminal to the second terminal. The loop portions are located on the same plane but do not intersect each other. The short-circuiting trimmable wire comprises a third terminal and a fourth terminal, and the third terminal and the fourth terminal are coupled with two arbitrary locations of the inductor wiring by cutting off the short-circuiting trimmable wire to change the inductance of the inductor winding, and further adjust the central frequency of the LC tank.

Further scope of applicability of the present invention will become apparent from the detailed description given hereafter. However, it should be understood that the detailed description and specific examples, while indicating preferred embodiments of the invention, are given by way of illustration only, since various changes and modifications within the spirit and scope of the invention will become apparent from this detailed description to those skilled in the art.

BRIEF DESCRIPTION OF THE DRAWINGS

FIG. 1A is a diagram of a conventional switching capacitor.
FIG. 1C is a diagram of a conventional switching inductor.
FIG. 2 is a diagram of a first embodiment for the central frequency adjustment device.

DESCRIPTION OF THE PREFERRED EMBODIMENTS

Figure 1B:
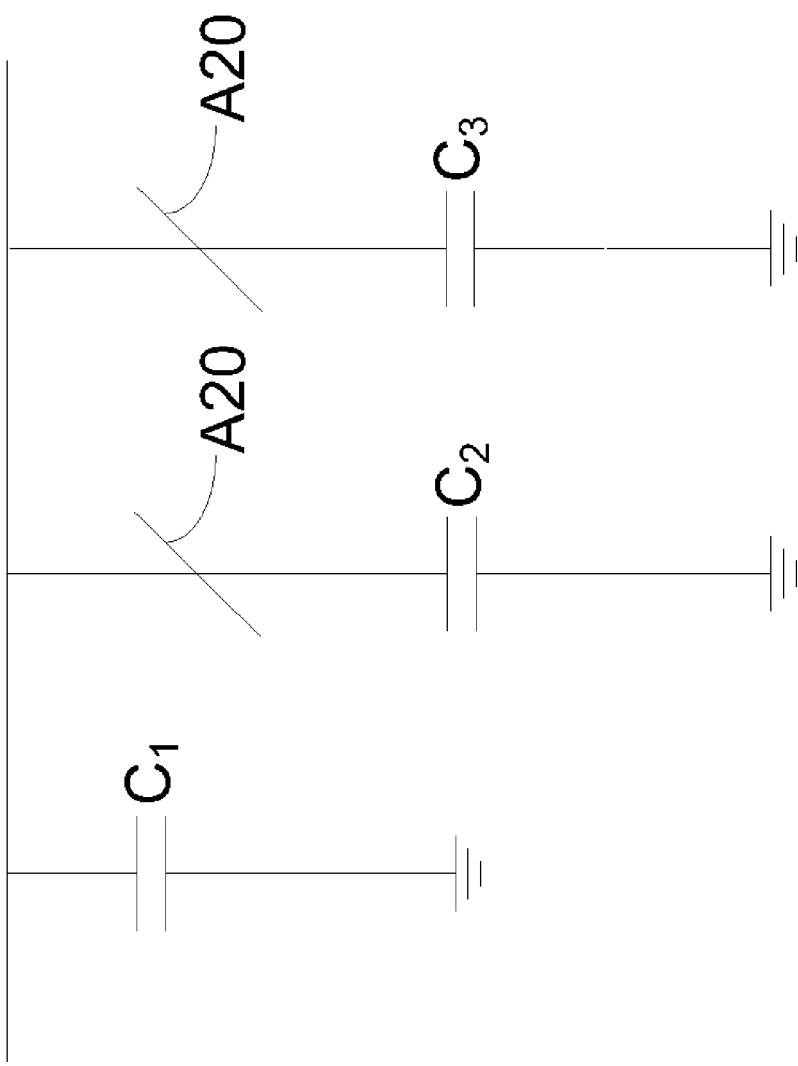
FIG. 1B is a diagram of a conventional trimmable capacitor.

Please refer to FIG. 2, which is a central frequency adjustment device for adjusting the central frequency of LC tank as the first embodiment of the present invention. As shown in FIG. 2, the central frequency adjustment device includes a first inductor 10, a second inductor 20, and a first trimmable wire 30.

The first inductor 10 includes a first end 12 and a second end 14. One end of the second inductor 20 is coupled with the second end 14 of the first inductor 10, while the other end of the second inductor 20 is coupled with another terminal. The present embodiment represents the terminal as grounding, but is not limited to it. The first trimmable wire 30 is connected to the first inductor 10 in parallel, and to the second inductor 20 in series for short-circuiting the first inductor 10 by cutting off the first trimmable wire 30 to adjust the central frequency.

The process of circuit fabrication suffers unavoidably from errors, so that the central frequency is somewhat offset from the ideal value of the design. In order to overcome the occurrence of errors, if the central frequency of the LC tank in the actual circuit has errors, the central frequency adjustment device of the present invention can be used to correct the central frequency, which is especially suitable for the application of an LC tank requiring fixed central frequency, and also requiring a high Q factor.

The central frequency (f) of the LC tank is $$f = \frac{1}{2\pi\sqrt{LC}}.$$

Thus, the central frequency is inversely proportionally to the square root of the capacitance or inductance. The central frequency adjustment device according to the present invention employs the parallel connection of the first trimmable wire 30 and the first inductor 10 for short-circuiting the first inductor 10. Therefore, the relationship of the central frequency to the first inductor 10 and the second inductor 20 has two possible outcomes, depending on whether or not the first trimmable wire 30 is cut off.

In the first instance, when the first trimmable wire 30 is not cut off because the first inductor 10 is formed as short-circuit by the first trimmable wire 30, the overall inductance would be the inductance of the second inductor 20. Therefore, if the first trimmable wire 30 is not cut off, the central frequency is inversely proportional to the square root of the inductance of the second inductor 20.

In the second instance, when the first trimmable wire 30 is cut off, the overall inductance would become the original inductance of the second inductor 20 added to the inductance of the first inductor 10. Thus, when the first trimmable wire 30 is cut off the central frequency is inversely proportional to the square root of the inductance sum of the second inductor 20 and the first inductor 10. It should be noted that cutting of the first trimmable wire 30 would increase the overall inductance, and further reduce the central frequency. Thus, when the central frequency is too high, the central frequency adjustment device could be used to adjust the central frequency, so as to reduce the value required by the design. Furthermore, the first trimmable wire 30 could be cut off directly if needed without using a switch (MOS transistor) element, so that parasitic resistance will not be generated, and the Q factor will not be affected.

Figure 3:
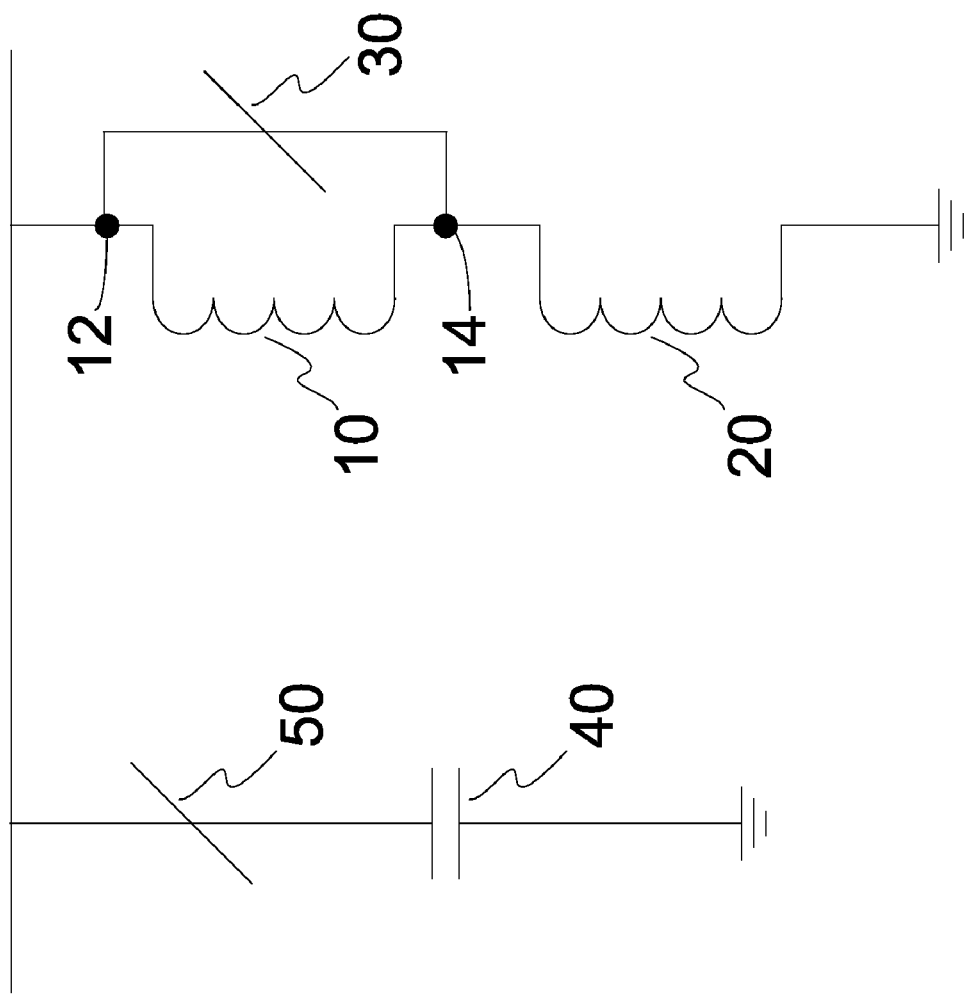
FIG. 3 is a diagram of a second embodiment for the central frequency adjustment device.

Please refer to FIG. 3, which is the second embodiment of the present invention. Except of the first inductor 10, the second inductor 20, and the first trimmable wire 30 included in the first embodiment, the second embodiment further comprises a capacitor 40, and a second trimmable wire 50.

The first inductor 10 includes a first end 12 and a second end 14. One end of the second inductor 20 is coupled with the second end 14 of the first inductor 10, and the other end is coupled with the other terminal. The present embodiment is represented with grounding, but not limited to it. The first trimmable wire 30 is connected to the first inductor 10 in parallel, and to the second inductor 20 in series for short-circuiting the first inductor 10. One end of the second trimmable wire 50 is coupled with the first end 12 of the first inductor 10, and capacitor 40 is connected to the second trimmable wire 50 in series.

The central frequency adjustment device of the second embodiment could adjust the central frequency by cutting off the first trimmable wire 30 or the second trimmable wire 50. When cutting off the first trimmable wire 30, the short-circuit status of the first inductor 10 originally in short-circuit is removed, and the overall inductance is increased with the inductance of the first inductor 10 from the original inductance of the second inductor 20 only. Thus, the overall inductance is increased, and the central frequency is reduced. Therefore, the central frequency of the LC tank is reduced by cutting off the first trimmable wire 30.

When the second trimmable wire 50 is cut off, because the second trimmable wire 50 is connected to capacitor 40 in series, the cutting of the second trimmable wire 50 isolates capacitor 40, so that the capacitance generated in capacitor 40 is removed. Thus, the cutting of the second trimmable wire 50 reduces the capacitance, and further increases the central frequency of the LC tank.

The central frequency adjustment device of the second embodiment cuts off directly the first trimmable wire 30 and the second trimmable wire 50 if needed, without using a switch (MOS transistor) element, so that parasitic resistance is not generated and the Q factor is not further affected. Furthermore, the central frequency adjustment device also includes the adjustable inductor and capacitor structure; the adjustable inductor structure is used to reduce the central frequency, and the adjustable capacitor is used to increase the central frequency. Thus, the central frequency adjustment device of the present invention overcomes the conventional shortcoming of the adjustable capacitor which is only able to increase the central frequency.

Moreover, the capacitance required by the central frequency $$f = \frac{1}{2\pi\sqrt{LC}}$$

the present invention can also be provided by the parasitic capacitance, but this is only an embodiment, to which the present invention should not be limited.

The progress of semiconductor manufacturing has lead to the integration of several circuits into a single chip. The electronic device has therefore become lighter, slimmer, shorter and smaller, so the area occupied by the electronic components is not too large. However, the inductor is made by winding coils, so it must be connected to another inductor in series if additional inductance is required, thus increasing the layout area in a chip. Therefore, the present invention provides an adjustable inductor layout, which could achieve all the advantages of the above-mentioned central frequency adjustment device, and further realize the layout in the chip with the advantage of not increasing the layout area.

The adjustable inductor layout according to the present invention is applied to the LC tank to adjust the central frequency of the LC tank. Please refer to FIG. 4, which is a diagram of the first embodiment of the adjustable inductor layout. The adjustable inductor layout of the first embodiment includes an inductor winding 60 and a short-circuit trimmable wire 70.

The inductor winding 60 comprises a first terminal 62 and a second terminal 64, and forming a plurality of loop portions 66 from the first terminal 62 to the second terminal 64, which are arranged on the same plane in a spiral shape. When the loop portions 66 are on the same plane, they would not be intersected with each other. The short-circuit trimmable wire 70 includes a third terminal 72 and a fourth terminal 74, in which the third terminal 72 is coupled with the second terminal 64 of the inductor winding 60, and the fourth terminal 74 is coupled with any one of the loop portions 66. Similarly, the third terminal 72 of the short-circuit trimmable wire 70 could also be coupled with the first terminal 62 of the inductor winding 60, and the fourth terminal 74 could be coupled with any one of the loop portions 66. The cutting of the short-circuit trimmable wire 70 can change the inductance of the inductor winding 60, and further adjust the central frequency of the LC tank.

Figure 4:
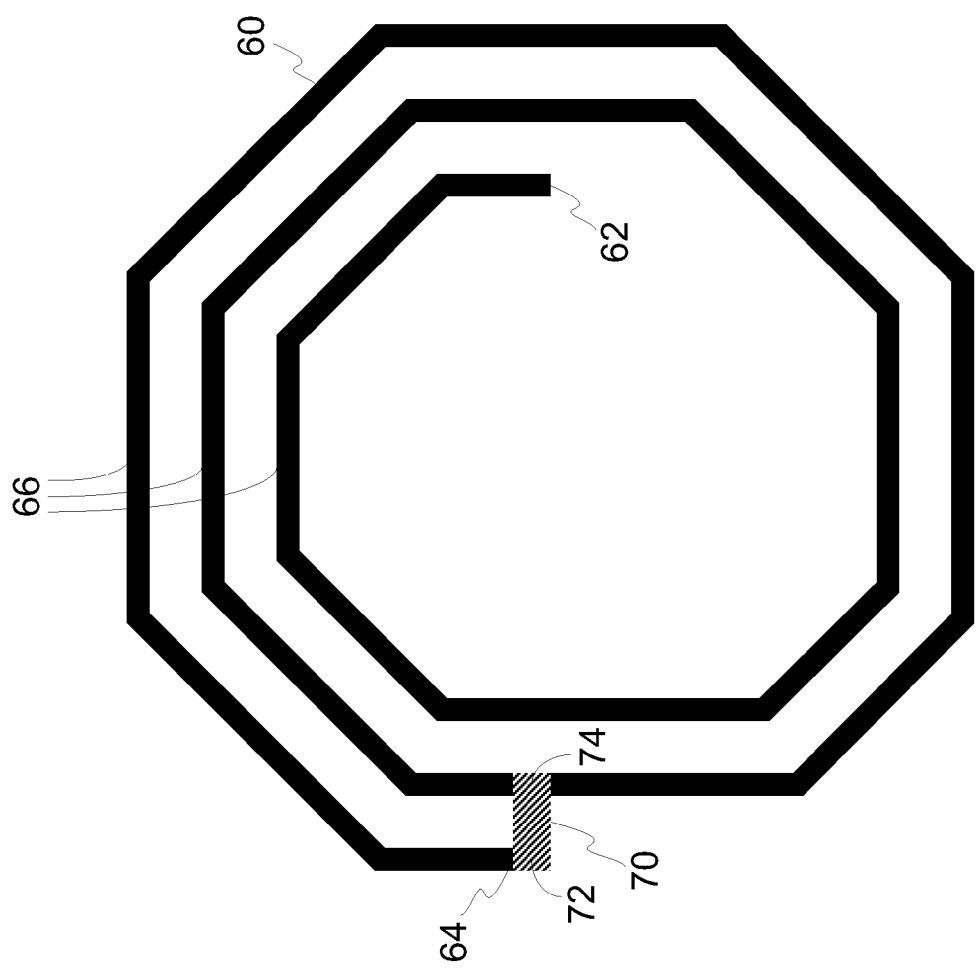
FIG. 4 is a diagram of a first embodiment for the adjustable inductor layout.

As shown in FIG. 4, if counted outwardly from the first terminal 62, the inductor winding 60 in the figure would be totally formed with three loop portions 66. If sequentially numbering the loop portions 66 outwardly from the first terminal 62, the third terminal 72 of the short-circuit trimmable wire 70 is coupled with the second terminal 64, and the fourth terminal 74 is coupled with the second loop portion; wherein, whether the short-circuit trimmable wire 70 is cut or not affects the relationship between the inductor winding 60 and the central frequency.

When the short-circuit trimmable wire 70 is not cut off, because the short-circuit trimmable wire 70 forms the short-circuit between the second terminal 64 and the second loop portion, the inductor winding 60 totally winds one and a half loop from the first terminal 62 to the second terminal 64.

When the short-circuit trimmable wire 70 is cut off, the short-circuit between the second terminal 64 and the second loop portion is removed. At this time, the winding number of the inductor winding 60 is increased to two and a half loops.

Figure 5:
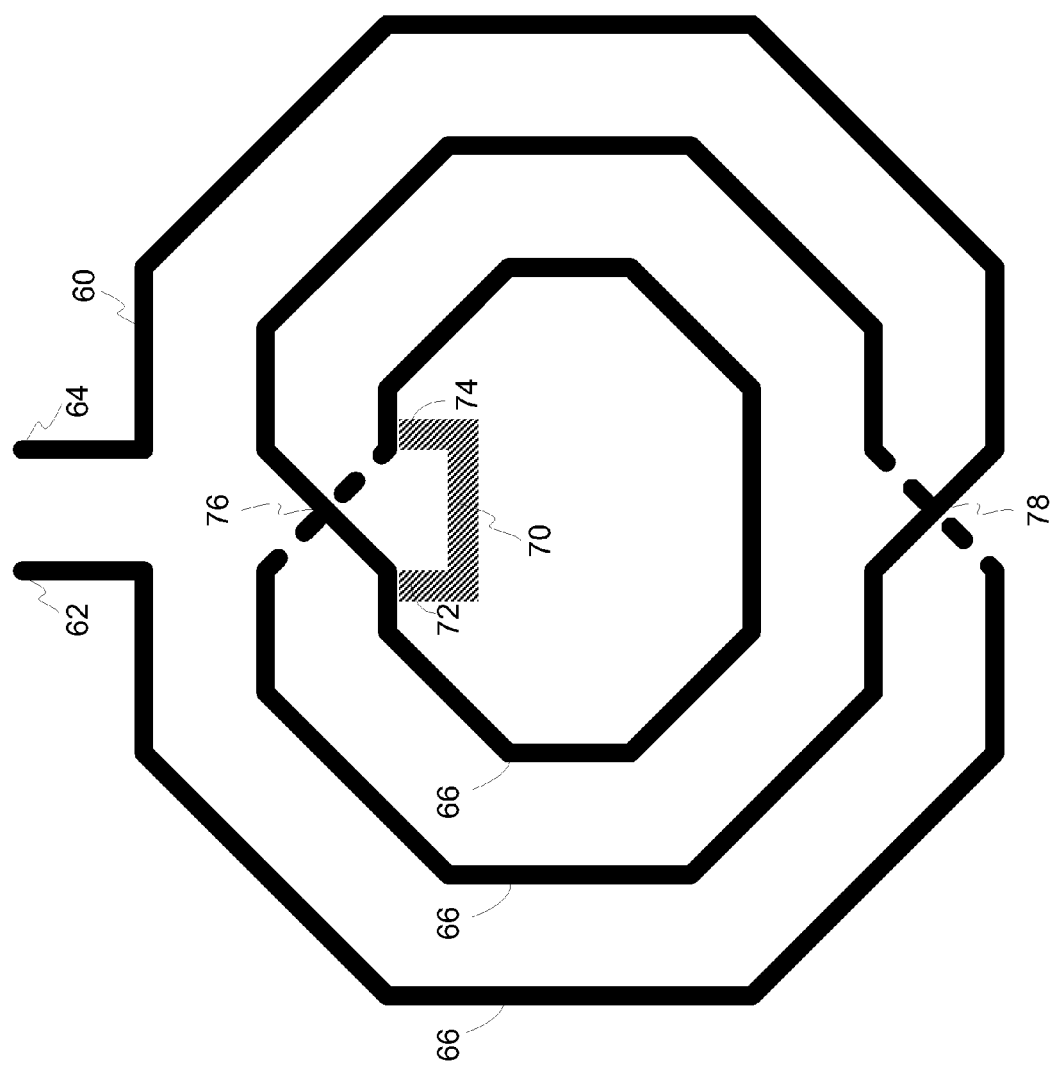
FIG. 5 is a diagram of a second embodiment for the adjustable inductor layout.

Please refer to FIG. 5, which is a diagram of a second embodiment of the adjustable inductor layout. In the present embodiment, the path from the first terminal 62 to the second terminal 64 of the inductor winding 60 is symmetrical to the path from the second terminal 64 to the first terminal 62. Because of the symmetrical structure of the inductor winding 60, it could be dedicated for use in a differential circuit. The loop portions 66 in the present embodiment are totally formed with N portions, and with intersections on different planes for N−1 portions. As shown in FIG. 5, the inductor winding 60 is totally formed with three loop portions 66, and formed with two intersections 76, 78 on different planes. The short-circuit trimmable wire 70 is provided with a third terminal 72 and a fourth terminal 74, which are coupled with any two locations of the inductor winding 60; so that whether or not the short-circuit trimmable wire 70 is cut off affects the relationship between the inductor winding 60 and the central frequency.

When the short-circuit trimmable wire 70 is not cut off, because the short-circuit trimmable wire 70 is formed as a short-circuit at the intersection 76, the routing from the first terminal 62 to the second terminal 64 will not pass the most inner loop of the loop portions 66. Thus, the inductor winding 60 wound only two loops in total.

When the short-circuit trimmable wire 70 is cut off, the short-circuited effect at the intersection 76 is removed. At this time, the number of winding for the inductor winding 60 from the first terminal 62 to the second terminal 64 increases to three loops.

The inductance in the chip layout is determined by the number of windings in the inductor winding 60. The larger number of windings, the larger the resultant inductance. According to the above-mentioned formula for central frequency, it is shown that the central frequency is inversely proportional to the square root of inductance of the inductor winding 60. Thus, the cutting of the short-circuit trimmable wire 70 increases the number of winding of the inductor winding 60, and thus increases the inductance. When the inductance is increased, the central frequency is reduced. Therefore, the cutting of the short-circuit trimmable wire 70 changes the inductance of the inductor winding 60, and further adjusts the central frequency.

For the adjustable inductor layout of the present invention, if an increase in the inductance is required it is not necessary to additionally connect in series to another inductor wound by the inductor winding 60, but only to cut off the short-circuit trimmable wire 70 to increase the inductance, and thus the layout area is not increased. Moreover, the short-circuit trimmable wire 70 can be coupled with any loop portion 66 in the inductor winding 60, which can be selected based on the design requirement. The coupling of the short-circuit trimmable wire 70 with different loop portions 66 makes different number of windings of the inductor winding 60 from the first terminal 62 to the second terminal 64, and thus generate different inductance.

The technical content of the present invention has been disclosed with the preferred embodiments as above. However, these disclosed embodiments are not used to limit the present invention. The skilled in the art could have various changes and modification to the embodiments without departing from the spirit and scope of the present invention, and the changes and modification should be all covered in the scope of the present invention. The patent protection scope for the present invention should be defined by the attached claims of the application.

What is claimed is:

1. A central frequency adjustment device for an LC tank circuit, which comprises:

a first inductor, including a first end and a second end;

a second inductor, with one end coupled with the second end of the first inductor;

a first trimmable wire, which is connected to the first inductor in parallel to short circuit the first inductor, and is connected to the second inductor in series, and arranged such that by cutting off the first trimmable wire, the short circuit is removed to adjust the central frequency;

a second trimmable wire, which is coupled with the first end of the first inductor; and a capacitor, which is connected to the second trimmable wire in series, and arranged such that by cutting off the second trimmable wire, the capacitor is electrically disconnected from the first inductor to adjust the central frequency.

2. A central frequency adjustment device according to claim 1, wherein the central frequency is reduced when the first trimmable wire is cut off.

3. A central frequency adjustment device according to claim 1, wherein the central frequency is increased when the second trimmable wire is cut off.

4. An adjustable inductor layout for an LC tank circuit, which is used to adjust a central frequency of the LC tank circuit, which comprises:

an inductor winding, including a first terminal and a second terminal, which defines a plurality of loop portions from the first terminal to the second terminal, and said loop portions do not intersect one another when on the same plane; and a short-circuit trimmable wire, including a third terminal and a fourth terminal, in which the third terminal and the fourth terminal are respectively coupled with any two locations in the inductor winding to short circuit at least a portion of the inductor winding, and arranged such that by cutting off the short-circuit trimmable wire, the short circuit is removed to change the inductance of the inductor winding, wherein the third terminal is coupled with one of the first terminal and the second terminal, and wherein the path from the first terminal to the second terminal is symmetrical to the path from the second terminal to the first terminal.

5. An adjustable inductor layout according to claim 4, wherein said loop portions are formed as N portions, and with N−1 intersections thereof on different planes.

6. An adjustable inductor layout according to claim 4, wherein the adjustable inductor layout is applied in a differential circuit.

7. An adjustable inductor layout according to claim 4, wherein the central frequency is reduced when the short-circuit trimmable wire is cut off.

\* \* \* \* \*